United States Patent [19]

Luce et al.

[11] 4,030,952

[45] June 21, 1977

[54] METHOD OF MOS CIRCUIT FABRICATION

[75] Inventors: Robert L. Luce, Los Altos Hills; Joseph P. Perry, Sunnyvale; James D. Sansburry, Palo Alto, all of Calif.

[73] Assignee: Fairchild Camera and Instrument Corporation, Mountain View, Calif.

[22] Filed: Oct. 6, 1975

[21] Appl. No.: 619,994

Related U.S. Application Data

[63] Continuation of Ser. No. 461,836, April 19, 1974, abandoned.

[52] U.S. Cl. .............................. 148/187; 148/188; 357/23; 357/54
[51] Int. Cl.² ...................................... H01L 21/225
[58] Field of Search .............. 357/23, 54; 148/188, 148/187

[56] References Cited

UNITED STATES PATENTS

| | | | |
|---|---|---|---|
| 3,604,107 | 9/1971 | Fassett | 148/188 X |
| 3,690,969 | 9/1972 | Hays et al. | 148/188 |
| 3,825,442 | 7/1974 | Moore | 148/187 X |
| 3,912,558 | 10/1975 | Luce et al. | 148/188 |

*Primary Examiner*—G. Ozaki
*Attorney, Agent, or Firm*—Alan H. MacPherson; Henry K. Woodward; Norman E. Reitz

[57] ABSTRACT

An improved method of MOS circuit fabrication includes the consecutive steps of formation of a selected material on the surface of an underlying substrate, removal of the selected material from selected portions of the underlying substrate, and formation of insulating material between the selected material and the underlying substrate on the surface of the newly exposed underlying substrate.

7 Claims, 4 Drawing Figures

METHOD OF MOS CIRCUIT FABRICATION

This application is a continuation of application Ser. No. 461,836, filed Apr. 19, 1974, now abandoned.

BACKGROUND OF THE INVENTION

1. Field of the Invention

This invention relates to fabrication of MOS circuits, and specifically to fabrication of MOS circuits by the isoplanar process as described in U.S. Pat. No. 3,648,125, entitled "Method of Fabricating Integrated Circuits with Oxidized Isolation and the Resulting Structure" issued Mar. 7, 1972, to Fairchild Camera and Instrument Corporation.

2. Description of the Prior Art

Conventional techniques for the fabrication of silicon gate integrated circuit structures typically involve the use of boron to form P+ regions in a silicon substrate. In one conventional technique, a polysilicon island is formed on the surface of a region of thin silicon dioxide formed on monocrystalline silicon. The oxide overlying selected regions of the monocrystalline silicon wherein source and drain regions are desired, typically in the immediate vicinity of the polysilicon island, is removed and boron oxide is deposited on the exposed monocrystalline silicon. During this processing P+ regions are formed where boron from the oxide diffuses into the underlying silicon. Conventionally, as the next step of the procedure, the boron oxide is removed and an insulating layer is deposited. Openings are then formed in the insulating layer for electrical connections to the P+ source and drain regions in the monocrystalline silicon.

Unfortunately this procedure by which prior art MOS circuits have been formed is beset with a number of problems. For example, structures formed by the above described technique are susceptible to photoengraving defects which lead to unwanted electrical connections between the metal interconnections and the polysilicon islands and the source or drain regions. Further, unwanted polysilicon gate-to-source or gate-to-drain electrical connections occur frequently.

It is now known that removal of the boron oxide which is used to form the source and drain regions, as in the conventional silicon gate process described above, can significantly increase the density of unwanted gate-to-source or gate-to-drain electrical connections. Although the reasons for the above described deficiencies are not fully understood, the resulting undesirable effects are nevertheless well known.

SUMMARY OF THE INVENTION

This invention circumvents the above described problems of the prior art. In the process disclosed in this invention, the boron oxide is allowed to remain on the surface of the wafer everywhere except for regions at which electrical contact to the source, drain or polycrystalline silicon regions is desired. Consequently, undesired electrical connections between the polycrystalline silicon gate and the source region or between the gate and the drain region are minimized. Additionally, surface irregularities are smoothed to allow formation of more uniform, and therefore more reliable, subsequent layers.

This invention represents a substantial change in the conventional procedure employed for forming silicon gate integrated circuit structures. According to this invention, a selected material, formed on the wafer surface, contains dopant which is used in forming the source or drain regions. After the formation of the source and drain regions, the selected material is not removed but rather is allowed to remain in place across the surface of the wafer. Selected portions of the selected material are then removed to provide for electrical contact to one or more underlying regions. Insulating material is then formed on the silicon, and during this procedure, the selected material is smoothed. Electrical contact is then made to the source, drain and polysilicon regions in a conventional well-known manner.

In one embodiment, the selected material comprises boron-oxide.

DESCRIPTION OF THE PREFERRED EMBODIMENTS

Figure 1A:
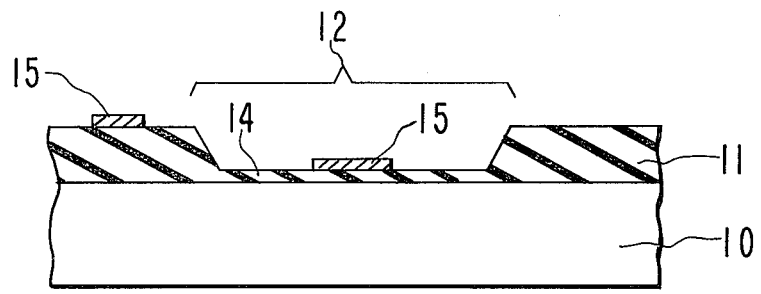
FIGS. 1a to 1d show the improved process for fabricating MOS circuits.

One embodiment of the process of this invention will be discussed with reference to FIGS. 1a to 1d. Referring now to FIG. 1a, a region of insulating material 11, generally known as field insulation, is formed upon the surface of substrate 10. In one embodiment, substrate 10 is silicon of a type suitable for the formation of MOS devices, while insulating material 11 is a silicon oxide, typically silicon dioxide. Insulating material 11 is removed from the surface of substrate 10 throughout region 12. Typically, this is accomplished by an etching process; however, other procedures can be used. A layer of insulating material 14 is then formed on substrate 10 throughout region 12. This material will typically be silicon dioxide; however, other materials which are not electrically conductive can also be used. Material 14 is thinner than layer 11 and ultimately will form the gate insulation of the resulting MOS device. Subsequently, a region of electrically conductive material 15 is formed on the surface of insulating material 11 and 14. In one embodiment this is accomplished by forming a layer of material 15 across the surface of insulating material 11 and 14, and then removing conductive material 15 from insulating material 11 and 14 except regions where the material is desired. Conductive material 15 typically will be polycrystalline silicon (often called polysilicon), although it is again noted that other appropriate electrically-conductive materials may also be employed.

Figure 1B:
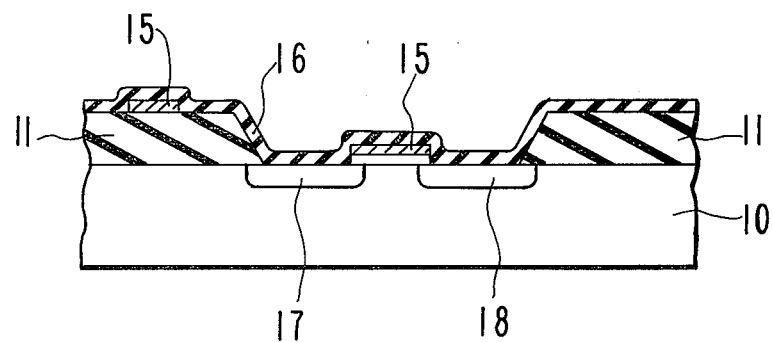
Figure 1C:
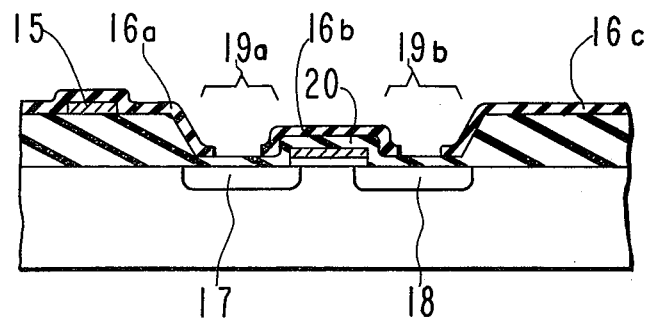
Figure 1D:
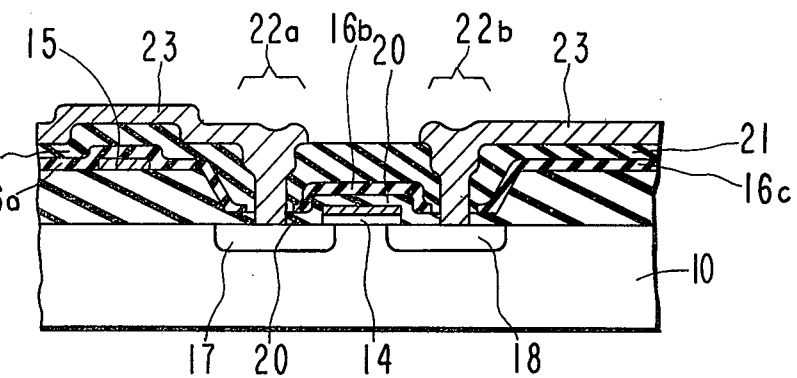

Referring now to FIG. 1b, insulating material is removed from the surface of substrate 10 except in regions beneath electrically conductive material 15. A layer of selected material 16 is then formed across the surface of insulating material 11, substrate 10, and electrically conductive material 15. In one embodiment, during formation of layer 16, some of the selected material will diffuse into substrate 10 to form region 17 and region 18. If boron oxide is chosen to be the selected material 16 as shown in FIGS. 1b, 1c, and 1d, it can be formed by a number of well-known chemical processes. For example, treatment with $BCl_3$ at 1050° C in an appropriate oxidizing ambient atmosphere is known to yield approximately 1300 Angstroms of heavily doped $B_2O_3 \cdot SiO_2$. Selected material 16 will be any material which contains dopant for the source and drain regions. In one embodiment of this invention, the selected material is boron oxide.

Referring now to FIG. 1c, selected material 16 is removed from the surface of substrate 10 at region 19a and region 19b. Typically this will be accomplished by an etching procedure; however, other procedures can be used.

As a feature of this invention, a layer of insulating material 20 is then formed beneath selected material 16a, 16b and 16c, and on the surface of substrate 10 in regions 19a and 19b. In one embodiment, insulating material 20 is formed by an oxidation process, for example, the well-known thermal oxidation process, and comprises an oxide of silicon, typically silicon dioxide. The insulating material 20 forms beneath selected material 16 and thus separates selected material 16 from substrate 10, as shown. The utilization of boron oxide as selected material 16, and silicon dioxide as insulating material 20, can provide a further advantage over prior art processes. Because boron oxide exhibits a negligible effect on the rate of formation of silicon dioxide beneath it, insulating material 20, typically silicon dioxide, will be a layer of nearly uniform thickness across the surface of substrate 10 in areas 19a, 19b and 16b, independent of whether or not it is formed beneath boron oxide 16.

Referring now to FIG. 1d, a layer of insulating material 21 is formed across the surface of selected material 16 and insulating material 20. Insulating material 20 and insulating material 21 are then removed from the surface of region 17 and region 18 at region 22a and region 22b. Regions 22a and 22b typically will be disposed entirely within former openings 19a and 19b, respectively; however, this is not necessary as long as portions of the top surfaces of source and drain regions 17 and 18 are exposed. Electrically conductive material 23 is then formed to provide electrical contact with region 17 and region 18. Typically, conductive material 23 will be aluminum although other metals or electrically conductive material can also be used, if appropriate.

The advantages of structures formed according to the process described in this invention are numerous. For example, in conventional fabrication techniques, redundant photomasking (i.e., use of more than one step of photomasking) is often used to reduce the density of defects caused by imperfections. Theoretically, defects in two or more masks have a low probability of overlying the same portion of the structure. This technique is used in the above described process by redundant removal of contact insulating material. That is, the oxide removal to expose regions for electrical contact is made in two steps. First, the selected material 16 is removed from the surface of region 17 and region 18 and over selected portions above region 15 and a thin insulating layer 20 is formed. Then, provision for electrical contact to region 17 and region 18 is provided by formation of insulating material 21, and then removal insulating material 21 and insulating material 20 in regions 22a and 22b. (see FIG. 1d). Electrical contact to conductive material 15 may be made at any desired location on the wafer, and is not shown in FIG. 1d.

Making provision for electrical contact to region 17 and region 18 in this manner results in a substantially thicker protective layer over the surface of substrate 10 in regions where electrical contact is not desired, than allowed by prior art processes. That is, using the process described in this invention, there are two protective layers - insulating material 20 and selected material 16 exterior to regions 22a and 22b.

In one embodiment, this invention therefore achieves, after formation of insulating material 21, a structure in which the material in regions wherein electrical contact is not made is thicker and more heavily doped with boron than those areas in which electrical contact to region 17 and region 18 are desired. This difference in thickness, as well as the inherent slower etch rate characteristics of boron oxide, offer significant additional protection against photoengraving defects.

Further, the process described in this invention allows an improved quality of metal-to-polysilicon gate electrical contact. If polysilicon is used for electrical connections between region 18 and gate 15, or between region 17 and gate 15, it can be formed on insulating material 11.

When the insulating material 14 is removed as shown in FIG. 1b, it is desirable to remove only insulating material not beneath the electrically conductive material 15. In the conventional prior art processes, however, to account for variations in whatever process is employed to remove insulating material 14, and to account for variations in the thickness of insulating material 14, the process of removal typically removes a slight amount of insulating material 11 beneath electrically conductive material 15. For example, if insulating material 14 is removed by an etching process, the extra time used during the etching process to remove all of insulating material 14 exterior to the region overlaid by material 15 will also cause a significant amount of insulating material 11 beneath electrically conductive material 15 to be removed. This results in stress concentrations and other undesirable edge effects when subsequent layers of material are formed on, and around, electrically conductive material 15. These edge effects include cracking of the conductive material employed for connections. The present invention circumvents this difficulty because the boron oxide layer 16, which is allowed to remain on the surface of the wafer, will soften and flow to fill the above noted voids under conductive layer 15 when processed at elevated temperatures characteristic of those used to form insulating layer 20. Consequently, subsequent layers formed on the surface of selected material 16 interface with the smoother surface, and fewer defective devices are created. Therefore, the overall manufacturing yield and reliability are improved. Further, metal connections traversing the edge of electrically conductive material 15 are much less likely to exhibit self-shadowing or etching defects. These particular types of defects are common to sharp, undercut edges.

What is claimed is:

1. A method of fabricating a metal-oxide-semiconductor structure in a semiconductor substrate, said structure having source and drain regions separated by a gate region, comprising the steps of:
    forming a layer of selected dopant-containing material on surface portions of said semiconductor substrate overlying said source and drain regions to be formed with simultaneous diffusion of dopant from said material into said substrate,
    removing portions of said selected dopant-containing material over said source and drain regions,
    forming a first oxide insulation material on said semiconductor surface over said source and drain regions and beneath said dopant-containing material, and forming a second oxide insulation material over said dopant-containing material and over exposed portions of said first oxide insulation material whereby said first oxide insulation material, said dopant-containing material, and said second oxide insulation material cooperatively function as a protective layer for said metal-oxide-semiconductor structure.

2. A method as recited in claim 1 wherein said first oxide insulation material is formed by thermal oxidation of said semiconductor substrate.

3. A method as recited in claim 2 including before said step of forming a layer of selected dopant-containing material the steps of forming a layer of insulation material over said semiconductor substrate to produce field and gate insulation; and removing a portion of said gate insulation to expose the source and drain regions to be formed.

4. A method as recited in claim 3 and including removing portions of said first and second oxide insulation material over said source and drain regions and forming electrical connections with said source and drain regions.

5. A method as recited in claim 4 wherein said selected dopant-containing material includes boron oxide.

6. A method as recited in claim 5 wherein said semiconductor substrate material is monocrystalline silicon.

7. A method as recited in claim 6 wherein said field and gate insulation material is silicon dioxide.

* * * * *